United States Patent [19]
Kobayashi

[11] Patent Number: 5,202,572
[45] Date of Patent: Apr. 13, 1993

[54] THIN FILM TRANSISTOR

[75] Inventor: Kenichi Kobayashi, Kanagawa, Japan

[73] Assignee: Fuji Xerox Co., Ltd., Tokyo, Japan

[21] Appl. No.: 826,636

[22] Filed: Jan. 23, 1992

Related U.S. Application Data

[63] Continuation of Ser. No. 528,912, May 29, 1990, abandoned, which is a continuation of Ser. No. 410,094, Sep. 20, 1989, abandoned.

[30] Foreign Application Priority Data

Sep. 21, 1988 [JP] Japan .................. 63-234711

[51] Int. Cl.$^5$ .......................... H01L 29/784
[52] U.S. Cl. .......................... 257/60; 257/61
[58] Field of Search .............. 357/21.7, 23.7, 4; 437/184

[56] References Cited

U.S. PATENT DOCUMENTS

| 4,778,773 | 10/1988 | Sukegawa | 357/23.7 |
| 4,788,157 | 11/1988 | Nakamura | 357/23.7 |
| 4,821,092 | 4/1989 | Noguchi | 357/23.7 |
| 4,905,066 | 2/1990 | Dohjo et al. | 357/23.7 |

FOREIGN PATENT DOCUMENTS

| 60-083370 | 5/1985 | Japan | 357/23.7 |
| 60-183770 | 9/1985 | Japan | 357/23.7 |
| 63-308384 | 6/1987 | Japan | 357/23.7 |
| 63-205963 | 8/1988 | Japan | 357/23.7 |
| 62-221678 | 9/1988 | Japan | 437/184 |
| 1-050567 | 2/1989 | Japan | 357/23.7 |
| 1-050567 | 8/1989 | Japan | 357/23.7 |

Primary Examiner—William D. Larkins
Attorney, Agent, or Firm—Spensley Horn Jubas & Lubitz

[57] ABSTRACT

A thin-film transistor basically comprises an insulating substrate, a gate electrode formed on the substrate, a gate insulating layer covering the gate electrode, a semiconductor layer formed on the gate insulating layer, and source/drain electrodes electrically connected to the semiconductor layer. An insulating layer is interposed between the source/drain electrodes and the semiconductor layer, and the source/drain electrodes are electrically connected to the semiconductor layer through a pair of openings provided in the insulating layer. The connection to the semiconductor layer is made directly or via an electrical connection member.

2 Claims, 9 Drawing Sheets

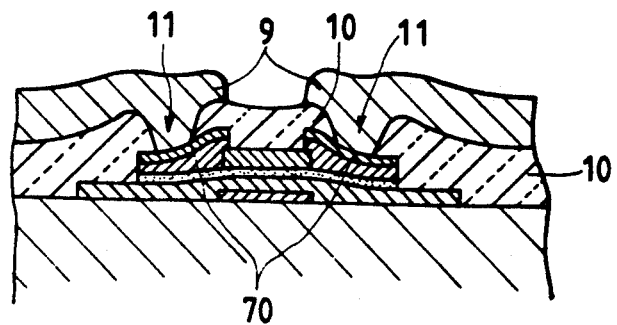
FIG. 6(J)
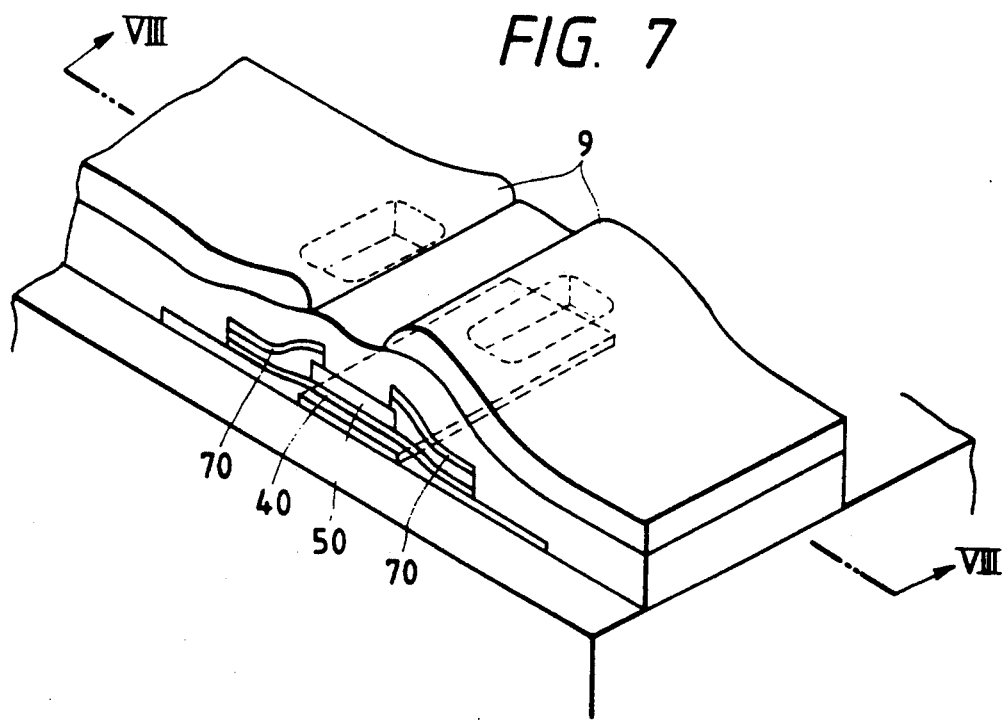
FIG. 7
FIG. 8
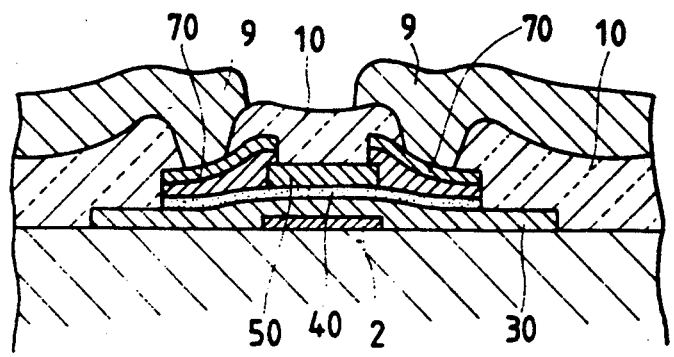

THIN FILM TRANSISTOR

BACKGROUND OF THE INVENTION

The present invention relates to a thin-film transistor used for driving an image sensor, electroluminescence display, liquid crystal display and the like, and more particularly to an improvement which can reduce variation of the on-current and off-current among individual thin-film transistors fabricated, and also can reduce a level of the off-current.

As a thin-film transistor of the above kind, there has been known one whose main part consists of, as shown in FIGS. 9-11, a glass substrate (a), a gate electrode (b) formed on the glass substrate (a), a gate insulating layer (c) covering the gate electrode (b), a first amorphous semiconductor layer (d) deposited on the gate insulating layer (c), a protective film (e) provide, as required, on the first amorphous semiconductor layer (d) and at the area corresponding to the gate electrode for protecting the first amorphous semiconductor layer (d), a second amorphous semiconductor layer (f) for ohmic contact containing trivalent or pentavalent impurity atoms and formed on the first amorphous semiconductor layer (d), source/drain electrodes (g), (h) electrically connected to the second amorphous semiconductor layer (f), and a diffusion preventive layer (j) for preventing the diffusion of the metal constituting the source/drain electrodes (g), (h) into the second amorphous semiconductor layer (f).

The conventional thin-film transistor of the above kind is fabricated through various steps as shown in FIG. 12(A) to FIG. 12(L).

Namely, as shown in FIGS. 12(A) and 12(B), on a glass substrate (a) with a gate electrode (b) formed thereon, there are deposited sequentially an $SiN_x$ insulating coating (c') which is to become the gate insulating layer (c), an amorphous silicon (a-Si) semiconductor coating (d') which is to become the first amorphous semiconductor layer (d), and an $SiN_x$ protective coating (e') which is to become the protective layer (e). Then the protective layer (e) is formed by selectively removing the protective coating (e') by photoetching, as shown in FIG. 12(C).

Next, a second amorphous semiconductor layer forming film (f') made of amorphous silicon (a-Si) containing pentavalent phosphorus (P) atoms, and a diffusion preventive layer forming film (j') made of chromium (Cr) are deposited sequentially as shown in FIG. 12(D). After forming a patterned resist film ($k_1$) on the diffusion preventive layer forming film (j') as shown in FIG. 12(E), an etching is performed using an etchant consisting of a mixture, for example, of ammonium cerium nitrate (IV) and perchloric acid to remove the portion of the diffusion preventive layer forming film (j') not being covered by the resist film ($k_1$). Then, the resist film ($k_1$) is removed to expose the diffusion preventive layer (j) as shown in FIG. 12(F).

After forming again a resist film ($k_2$) in patterned form on the diffusion preventive layer (j) as shown in FIG. 12(G), the substrate is subjected to an etching treatment which uses, for example, a hydrofluoric acid/nitric acid type etchant to remove the portion of the second amorphous semiconductor layer forming film (f') not being covered by the resist film ($k_2$) and the outer portion of the underlying amorphous silicon (a-Si) semiconductor coating (d'). Then, removing the resist film ($k_2$), there appears the structure containing the second amorphous semiconductor layer (f) and the first amorphous semiconductor layer (d), as shown in FIG. 12(H).

Further, as shown in FIG. 12 (I), the gate insulating film (c) is formed by selectively removing the $SiN_x$ insulating coating (c') by photoetching. Then, a layer (gh) of metal such as aluminum (Al) for the source/drain electrodes is deposited uniformly all over the surface as shown in FIG. 12(J). After a patterned resist film ($k_3$) is formed as shown in FIG. 12(K) on the metallic layer (gh), source/drain electrodes (g), (h) are formed by removing the portion of the metallic layer (gh) not being covered by the resist film ($k_3$) by an etching treatment as shown in FIG. 12(L), obtaining a thin-film transistor.

Now, in the above conventional thin film transistor, when the position of the resist film ($k_3$) is deviated to one side due to misalignment at the time of formation of the resist film ($k_3$) on the metallic layer (gh), the source/drain electrodes (g), (h) are formed such that one end of the electrodes (g), (h) is extended toward the protective layer (e) or the center of the first amorphous semiconductor layer (d). As a result, one of the source/drain electrodes (g), (h) and the protective layer (e) or the first amorphous semiconductor layer (d) will be connected directly in a portion. This causes a problem that the on-current and off-current are varied among thin-film transistors obtained depending on the size of the connection portion.

The inventor considers based on his analysis that the above variations are due to the following reasons.

Namely, in the thin-film transistor with the protective layer (e) as shown in FIG. 14, when a voltage is applied between the source/drain electrodes (g) and (h), a channel serving as a current path is formed, depending upon the kind of material forming the protective layer (e), in the interface between the protective layer (e) and the first amorphous semiconductor layer (d) due to the electric field, and electrons may be trapped by the protective film (e). When there is a variation in the size of the connection portion between the source/drain electrodes (g), (h) and the protective film (e), the number of electrons trapped by the protective film (e) is varied accordingly, so that there is produced a variation in the current flowing through the first amorphous semiconductor layer (d) among thin-film transistors fabricated.

On the other hand, in the case of the thin-film transistor without the protective layer as illustrated in FIG. 15, if there is a variation in the size of the connection portion between the source/drain electrodes (g), (h) and the first amorphous semiconductor layer (d), the effective gate length (a) is changed and the number of electrons trapped by the first amorphous semiconductor layer (d) is varied. As a result, the current flowing through the first amorphous semiconductor layer (d) is varied, so that there is generated a variation in the on-current and off-current among individual thin-film transistors fabricated.

In the conventional thin-film transistor, there is adopted a protection method in which the exposed surface (see FIGS. 14 and 15) of the protective film (e) or the first amorphous semiconductor layer (d) is covered with an appropriate film (not shown).

However, air, water, or the like may infiltrate into the space between the exposed surface and the appropriate film during the covering process. When such an item is attached to the surface of the protective film (e) or the first amorphous semiconductor layer (d), it tends to cause a leak, so that there occurs a problem that the off-current of the thin-film transistor is increased.

SUMMARY OF THE INVENTION

The present invention was motivated in view of the aforementioned problems, and it is an object of the present invention is to provide a thin-film transistor which has smaller variation of the on-current and off-current, and also the off-current of a small value.

A thin-film transistor of the invention is basically equipped with an insulating substrate, a gate electrode formed on the substrate, a gate insulating layer covering the gate electrode, a semiconductor layer formed on the gate insulating layer, and source/drain electrodes connected to the semiconductor layer either directly or via an electrical connection member. The present invention is characterized in that an insulating layer is interposed between the source/drain electrodes and the semiconductor layer or the electrical connection member, and the source/drain electrodes and the semiconductor layer or the electrical connection member are connected via respective openings provided in the insulating layer.

The electrical connection member may consist of a second semiconductor layer for ohmic contact containing trivalent or pentavalent impurity atoms and a diffusion preventive layer formed thereon.

In accordance with the construction describe above, the insulating layer is interposed between the source/drive electrodes and the semiconductor layer or the electrical connection member, and the source/drain electrodes and the semiconductor layer or the electrical connection member are connected via openings provided in the insulating layer, so that the source/drain electrodes and the semiconductor layer or the electrical connection member will not be connected in any portion other than the openings.

As a result, even when there occurs a misalignment in the resist film formation during the process of forming the source/drain electrodes, the size of the connection portion between the source/drain electrodes and the semiconductor layer or the electrical connection member will not be changed. Therefore, the electric field due to the source/drain electrode voltages acting on the protective layer or the like will be diminished because of existence of the gap between the source/drain electrodes and the semiconductor layer or the electrical connection member. Moreover, since the surface of the protective film or the like is covered with the insulating film, it is possible to prevent the attachment of air, moisture or the like to that surface.

BRIEF DESCRIPTION OF THE DRAWINGS

FIGS. 6(A) to 6(J) are process diagrams for explaining fabrication of the thin-film transistor of FIG. 1;

FIG. 7 is a perspective view of a thin-film transistor whose source/drain electrodes are misaligned;

FIG. 8 is a sectional view taken along the line VIII—VIII in FIG. 7;

DETAILED DESCRIPTION OF THE INVENTION

Figure 1:
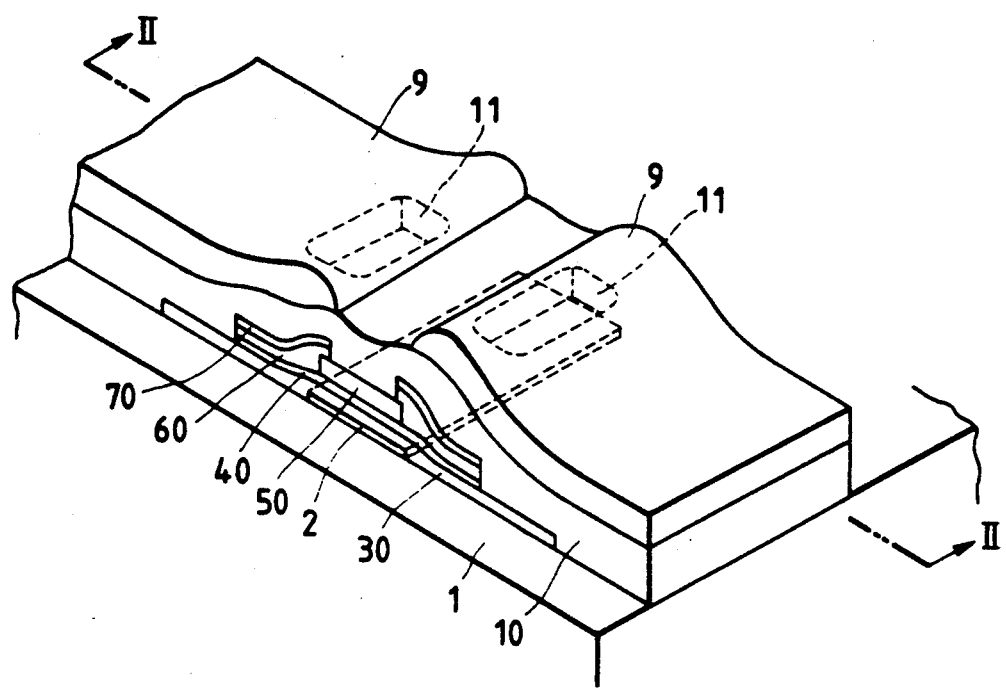
FIG. 1 is a perspective view of a thin-film transistor in accordance with an embodiment of the present invention.

Referring to the drawings, an embodiment of the present invention will be described in detail in the following.

Figure 2:
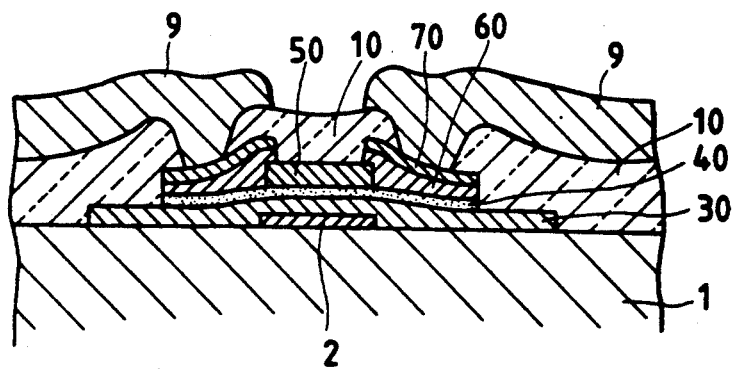
FIG. 2 is a sectional view taken along the line II—II in FIG. 1.

The main portion of the thin-film transistor in accordance with this embodiment is composed, as shown in FIG. 1 and FIG. 2, of a transparent glass substrate 1, a gate electrode 2 formed on the substrate 1, a gate insulating layer 30 covering the gate electrode 2, a first amorphous semiconductor layer 40 deposited on the gate insulating layer 30, a protective layer 50 for protecting the first amorphous semiconductor layer 40 provided on the first amorphous semiconductor layer 40 and at the area corresponding to the gate electrode 2, a second amorphous semiconductor layer 60 for ohmic contact containing trivalent or pentavalent atoms and formed on the first amorphous semiconductor layer 40, a diffusion preventive layer 70 for preventing the diffusion of metallic material constituting source/drain electrodes 9 into the second constituting source/drain electrodes 9 into the second amorphous semiconductor layer 60, an insulating layer 10 having openings 11 at the portions corresponding to the respective diffusion preventive layers 70 and deposited on the diffusion preventive layer 70 and the protective layer 50, and the source/drain electrodes 9 connected to the diffusion preventive layer 70 via the openings 11 in the insulating layer 10.

Figure 3:
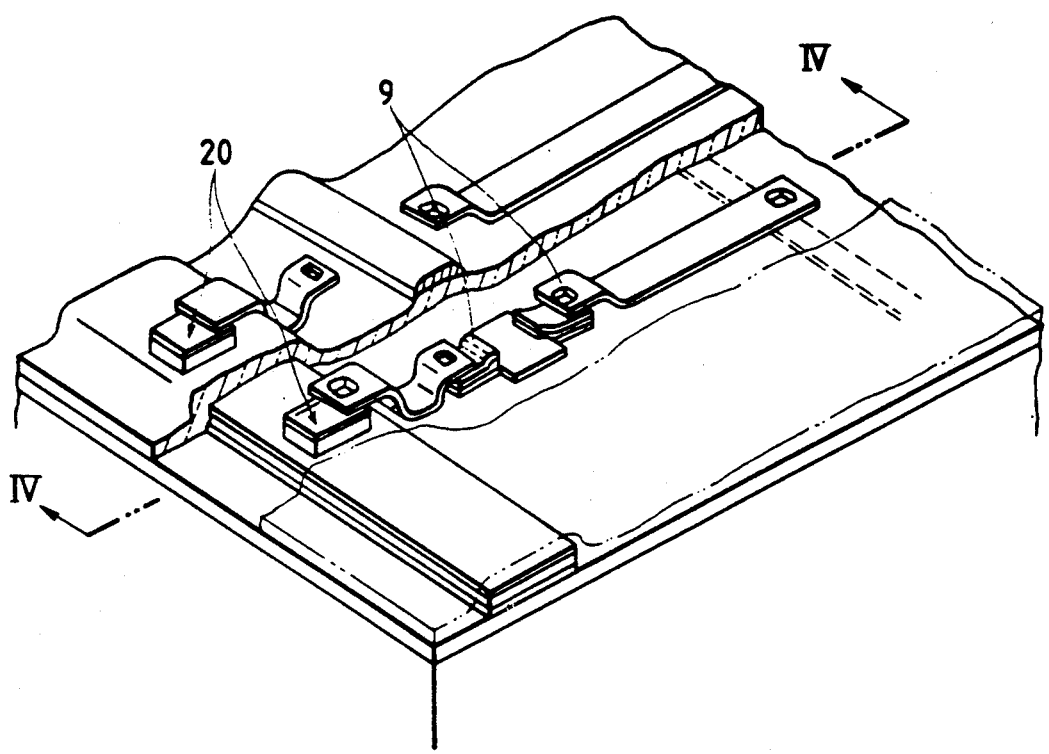
FIG. 3 is a perspective view of an image sensor incorporated with the transistor of FIG. 1.
Figure 4:
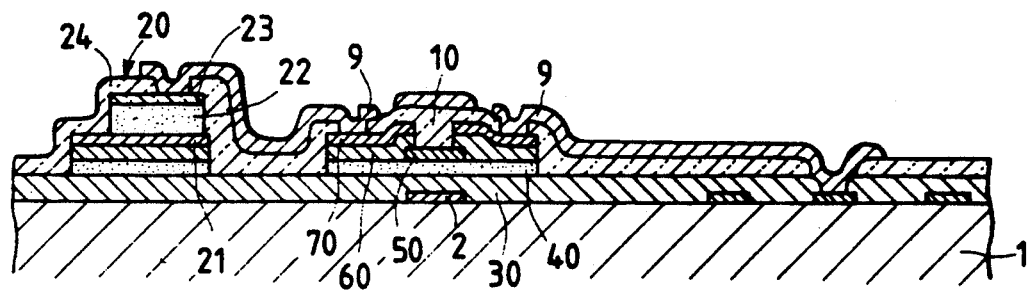
FIG. 4 is a sectional view taken along the line IV—IV in FIG. 3.
Figure 5:
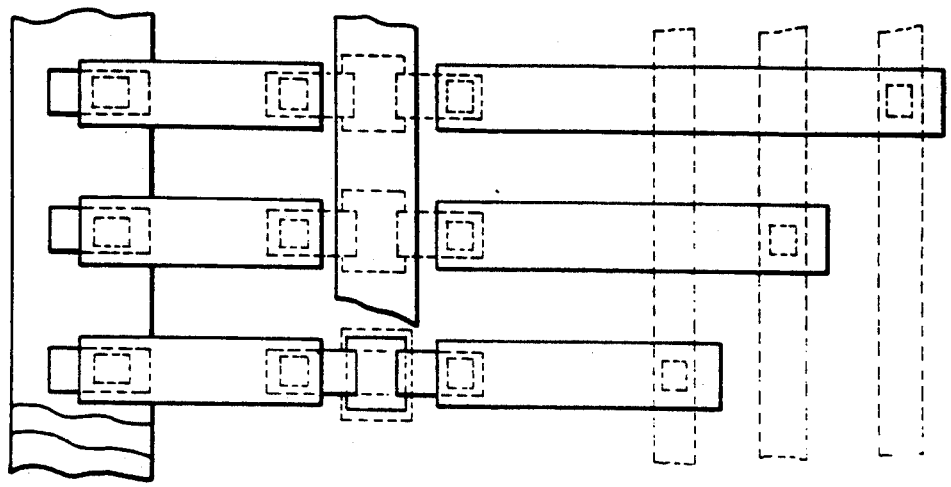
FIG. 5 is a plan view of FIG. 3.

The thin-film transistor may be used to drive an image sensor which consists of a chromium electrode 21, a photoconductive layer 22 and a transparent electrode 23, as shown in FIG. 3 to FIG. 5.

The above thin-film transistor is fabricated through the steps described below.

Figure 6A:
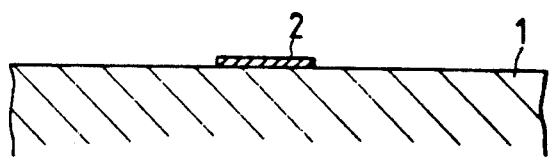
Figure 6B:
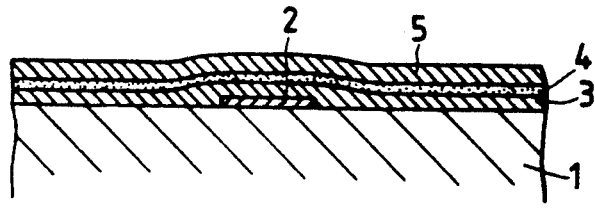

First, after depositing, as shown in FIG. 6(A), a 500 Å-thick chromium (Cr) gate electrode 2 on a transparent glass substrate (trade name: Corning 7059) 1 by means of sputtering and photoetching, a 3000 Å-thick amorphous silicon nitride ($SiN_x$) insulating coating 3 for gate insulation, a 1000 Å-thick amorphous silicon (a-Si) semiconductor coating 4 for the first amorphous semiconductor layer, a 1500 Å thick amorphous silicon nitride ($SiN_x$) protective coating 5 for the protective layer are deposited in succession as shown in FIG. 6(B), with the plasma CVD (chemical vapor deposition) under a vacuum condition.

Figure 6C:
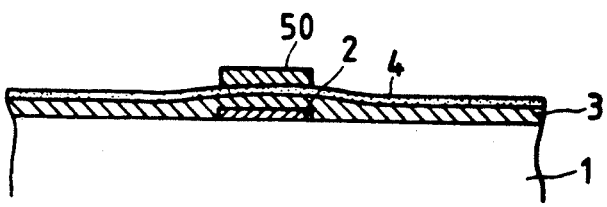

Next, a photoresist film (positive type resist material manufactured by Tokyo Ohka Kogyo Co., trade name: OFPR-800) is uniformly spin-coated on the protective coating 5 under the condition where the vacuum is canceled. After subjecting the substrate to a patterned exposure of ultraviolet rays by means of a reduction-projecting stepper device via a glass mask (not shown) to alter the irradiated portion to become soluble to a developer, a patterned resist film (not shown) is formed by dissolving and removing the irradiated portion with a developer (nonmetallic developer manufactured by Tokyo Ohka Kogyo Co., trade name: NHD-3). Then, the protective coating 5 is dissolved and removed partially by the use of BHF (buffered hydrofluoric acid which is a mixed solution of hydrofluoric acid and ammonium fluoride with a weight mixing ratio of 1:50), and the resist film is removed to expose the protective layer 50 as shown in FIG. 6(C).

Figure 6D:
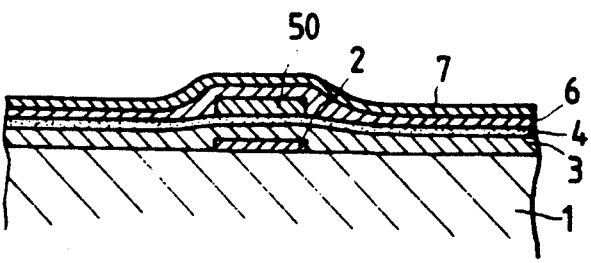

Then, the surface of the substrate 1 with the protective layer 50 thereon is subjected to treatments of oxide film removal and cleaning. Next, the substrate is brought into a CVD processing chamber filled with gaseous nitrogen. After evacuating the chamber to a vacuum condition, a 1000 Å-thick second amorphous silicon layer forming film 6 made of $n^+$-amorphous-silicon (a-Si) containing pentavalent phosphorus (P) atoms, and a 1500 Å-thick chromium (Cr) diffusion preventive layer forming film 7 are deposited sequentially by means of the plasma CVD method (see FIG. 6(D)). In this case, the second amorphous semiconductor layer forming film 6 is deposited on the semiconductor coating 4 made of amorphous silicon using a mixed gas of phosphine ($PH_3$) and silane ($SiH_4$).

Figure 6E:
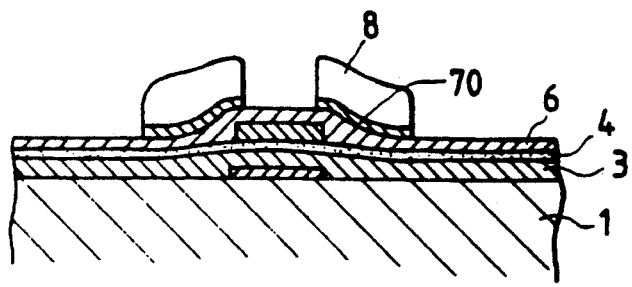
Figure 6F:
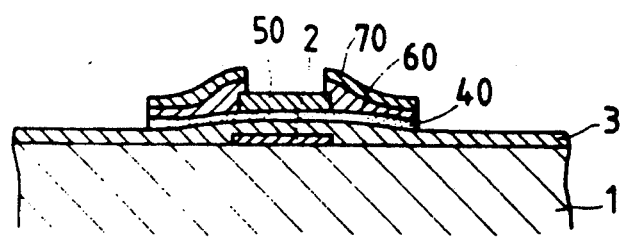
Figure 6G:
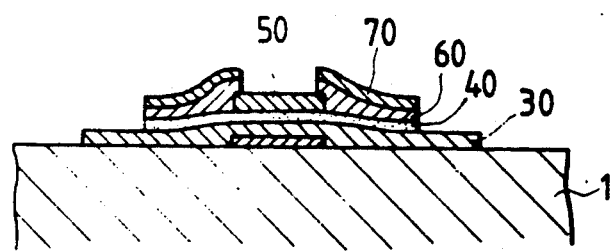

Subsequently, a patterned resist film 8 is formed on the diffusion preventive layer forming film 7, in the state where the vacuum condition is canceled, by means of the method similar to that of forming the above-described resist film, as shown in FIG. 6(E). Then, the substrate is subjected to an etching which uses an etchant consisting of a mixture of ammonium cerium nitrate (IV) and perchloric acid. Thereby the diffusion preventive layer 70 is formed by removing the portion of the diffusion preventive layer forming film 7 not being covered by the resist film 8. Further subjecting the substrate to an etching that uses a phosphoric acid based etchant with the resist film 8 intact, the second amorphous semiconductor layer 60 and the first amorphous semiconductor layer are formed 40 by removing the portion of the second amorphous semiconductor layer forming film 6 not being covered by the resist film 8 and the outer& portion of the amorphous silicon semiconductor coating 4. The resist film 8 is then removed, so that the substrate assumes the structure shown in FIG. 6(F). Then, the amorphous silicon nitride ($SiN_x$) insulating coating 3 is partially removed by the photoetching process similar to that in the conventional fabrication process to form the gate insulating layer 30, as shown in FIG. 6(G).

Figure 6H:
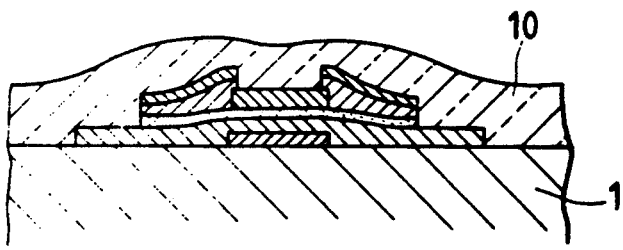
Figure 6I:
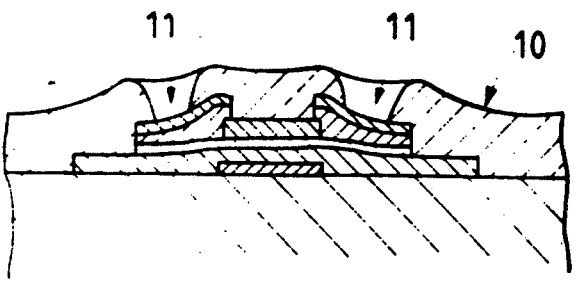
Figure 9:
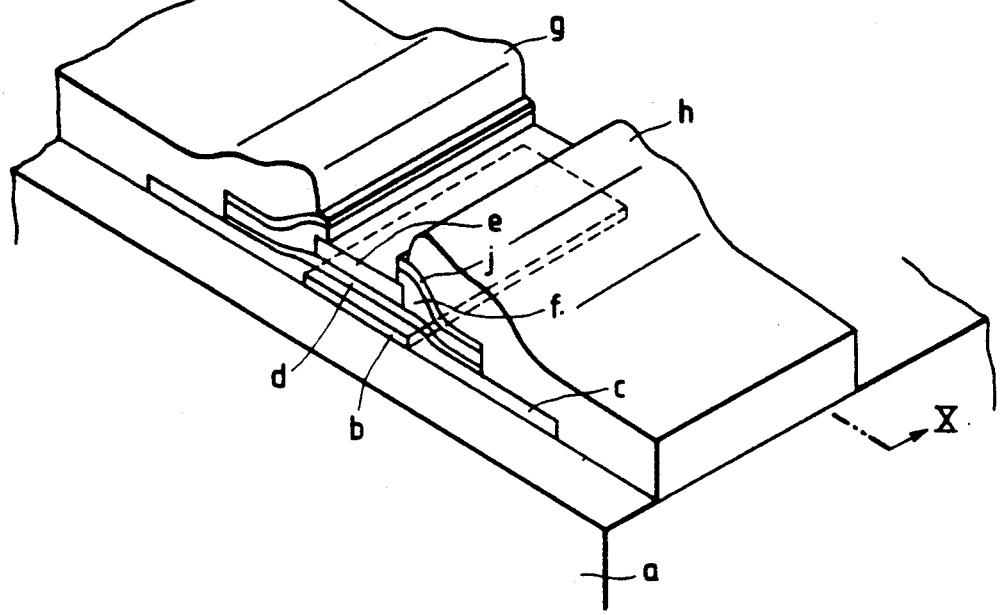
FIG. 9 is a perspective view of a conventional thin-film transistor.
Figure 10:
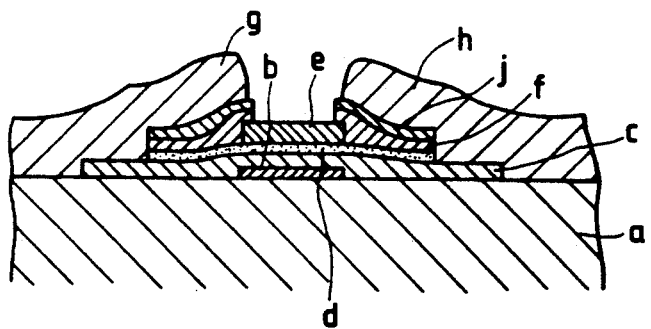
FIG. 10 is a sectional view taken along the line X—X in FIG. 9.
Figure 11:
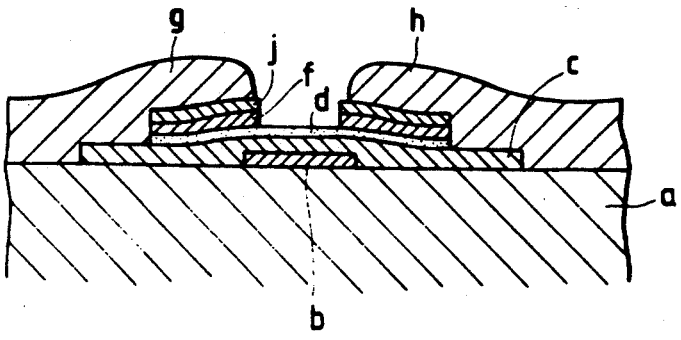
FIG. 11 is a sectional view of a thin-film transistor having no protective layer.
Figure 12A:
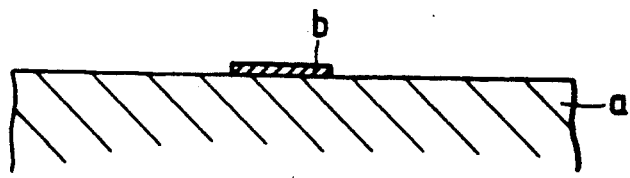
FIGS. 12(A) to 12(L) are process diagrams for explaining the fabrication of the conventional thin-film transistor of FIG. 9.
Figure 12B:
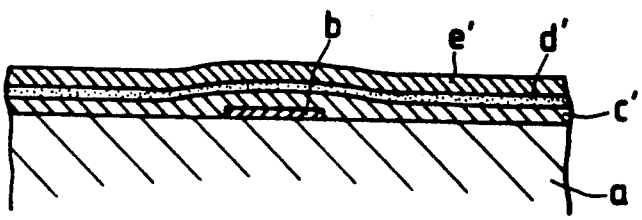
Figure 12C:
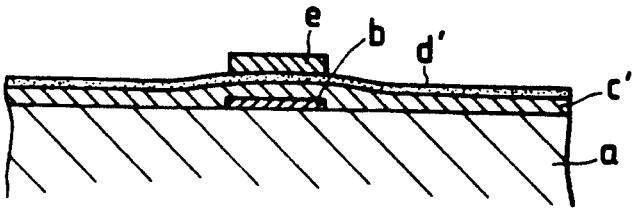
Figure 12D:
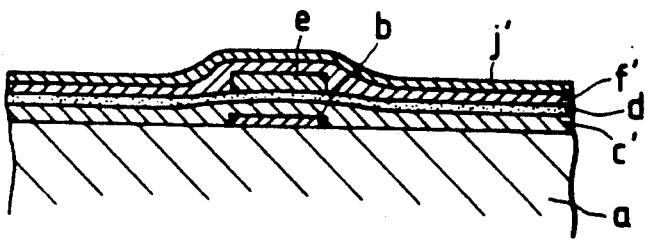
Figure 12E:
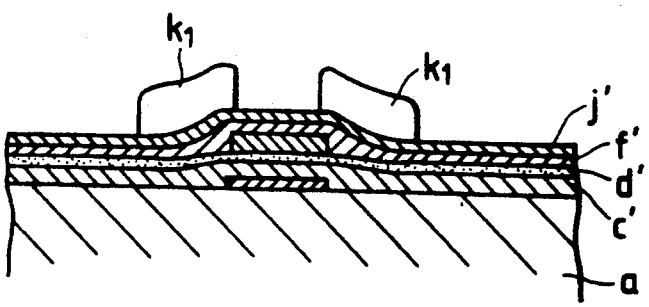
Figure 12F:
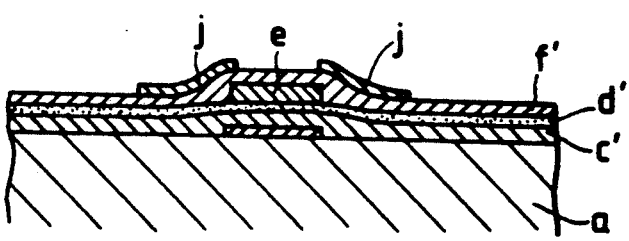
Figure 12G:
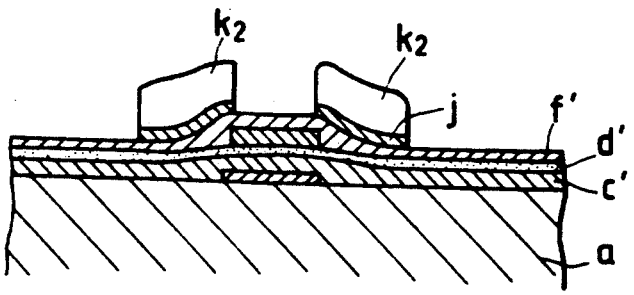
Figure 12H:
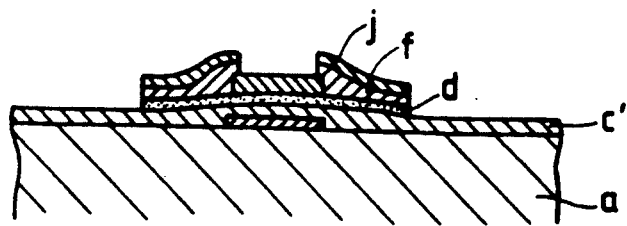
Figure 12I:
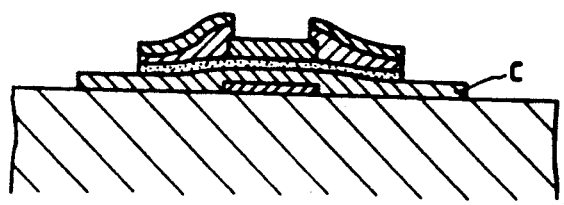
Figure 12J:
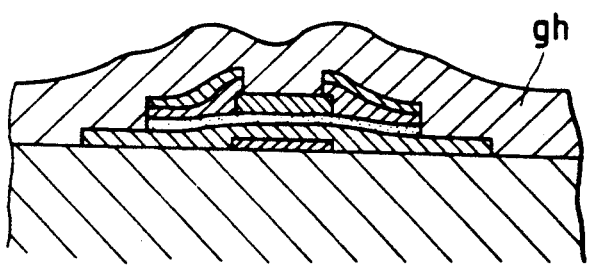
Figure 12K:
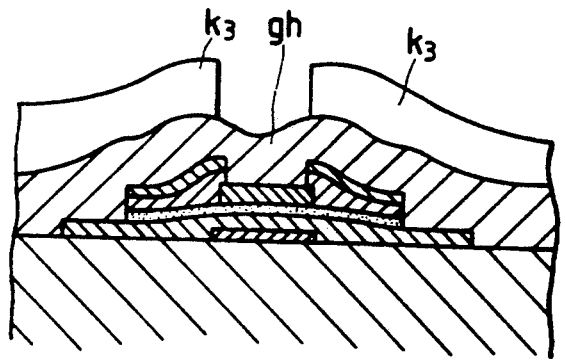
Figure 12L:
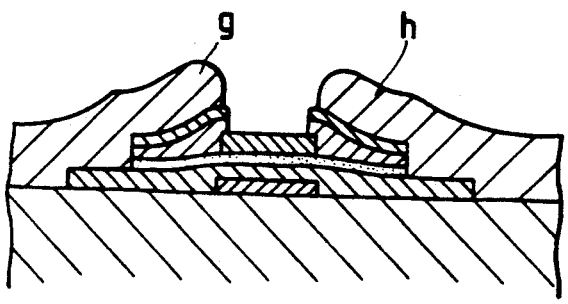
Figure 13:
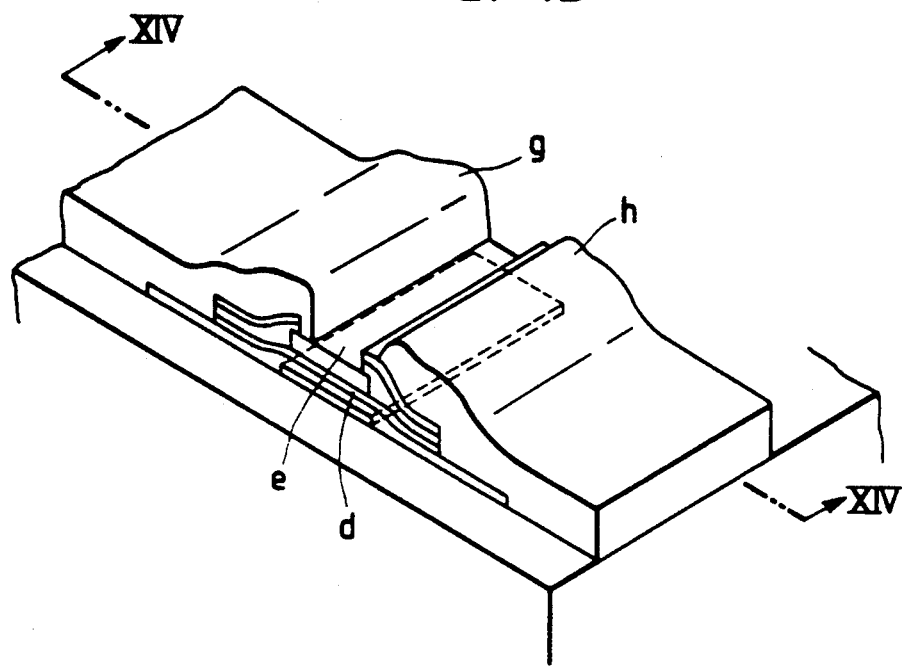
FIG. 13 is a perspective view of a conventional thin-film transistor whose source/drain electrodes are misaligned.
Figure 14:
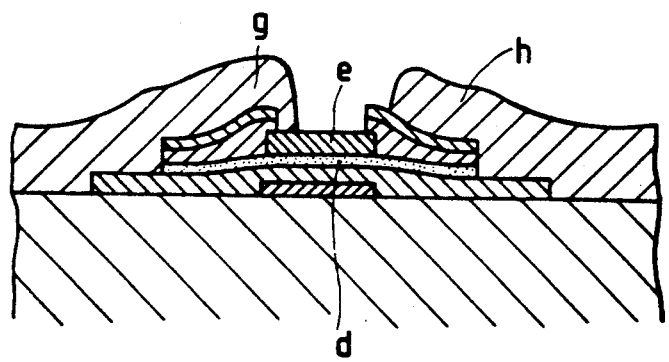
FIG. 14 is a sectional view taken along the line XIV—XIV in FIG. 13.
Figure 15:
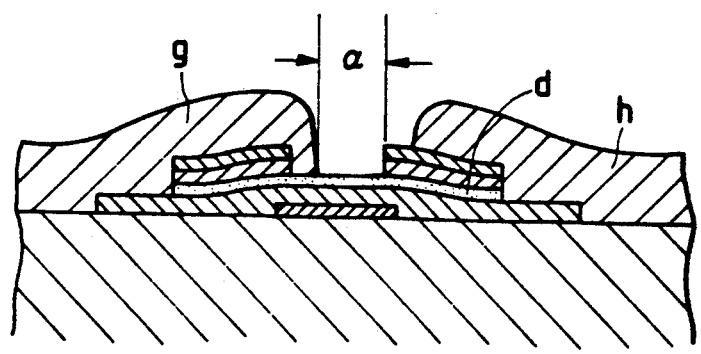
FIG. 15 is a perspective view of a conventional thin-film transistor with no protective layer whose source/drain electrodes are misaligned.

Further, after giving degreasing and cleaning treatments to the surface of the substrate 1, an insulating layer 10 is formed by depositing 1 $\mu$m of polyimide resin on the surface as shown in FIG. 6(H), and openings 11 called "via holes" are opened by photolithographic etching method as shown in FIG. 6(I).

Next, a 1 $\mu$m-thick aluminum (Al) layer for the source/drain electrodes is deposited uniformly all over the surface of the substrate 1, and thereafter source/drain electrodes 9 are formed by selectively removing the aluminum (Al) layer by the photoetching method similar to the conventional process, to obtain a thin-film transistor in which the source/drain electrodes 9 and the diffusion preventive layer 70 are connected via the openings 11 as shown in FIG. 6(J).

As described above, the insulating layer 10 is interposed between the source/drain electrodes 9 and the diffusion preventive layer 70, and the source/drain electrodes and the diffusion preventive layer 70 are connected via the openings 11 provided in the insulating layer 10, so that the source/drain electrodes 9 and the diffusion preventive layer 70 will not be connected in any portion other than the openings 11.

Accordingly, even when the position of formation of the resist film is a little deviated in forming the source/drain electrodes 9, the size of the connection portion between the source/drain electrodes 9 and the diffusion preventive layer 70 is not changed. Moreover, the electric field due to the source/drain electrode voltages and acting on the protective film 50 is diminished because of presence of the gap between the source/drain electrodes 9 and the diffusion preventive layer 70 which corresponds to the thickness of the interposed insulating layer 10. As a result, the formation of a channel that acts as a current path is hard to be formed in the interface between the protective film 50 and the first amorphous semiconductor layer 40. This presents an advantage of preventing the occurrence of variation of the on-current and off-current among individual thin-film transistors fabricated.

Further, in this transistor, the surface of the protective film 5 is covered with the insulating layer 10, so that it is possible to prevent the attachment of air, moisture or the like. Therefore, the transistor has an advantage of reduction of its off-current level because a leak is hard to occur.

According to the measurements of the dispersion of the on-current and off-current for a plurality of thin-film transistors fabricated in accordance with the above embodiment, the on-current ranged from 20 to 25 $\mu$A and the off-current ranged from 10 to 50 pA. Compared with the ranges of dispersion for the conventional thin-film transistors which are 15 to 30 $\mu$A for the on-current and 50 to 400 pA for the off-current, it was confirmed that a marked improvement was attained with the invention. Moreover, it was confirmed also that the level of the off-current itself was reduced substantially.

Furthermore, as shown in FIGS. 3 to 5, since the thin-film transistor in accordance with the present embodiment can be connected to the photosensor 20 formed on the same substrate 1, the material for forming the protective layer 24 to protect the surface of the transparent electrode 23 of the photosensor 20 and the material for forming the insulating film 10 may be made identical. In this case, the forming process of the protective layer 24 of the photosensor 20 and the insulating layer 10 can be carried out simultaneously, leading to the advantage that the insulating layer 10 can be formed without increasing the number of manufacturing steps.

Hereinafter, descriptions will be made as to materials for the respective elements constituting the thin-film transistor.

Glass, ceramic, polyimide resin or the like may be used for the insulating substrate, and amorphous silicon, polycrystalline silicon or the like may be used for the first and second amorphous semiconductor layers.

As the impurity atoms to be mixed in the second amorphous semiconductor layer for ohmic contact, there may be used such trivalent atoms as gallium (Ga), boron (B), indium (In) and aluminum (Al) and such pentavalent atoms as phosphorus (P), antimony (Sb) and arsenic (As).

As the metallic material which constitutes the source/drain electrodes, there may be used aluminum, chromiun (Cr), titanium (Ti), tungsten (W), molybdenum (Mo), etc. Further, as the material for the diffusion preventive layer to be disposed between the source/drain electrodes and the second amorphous semiconductor layer, there may be used chromium, titanium, tungsten, molybdenum, tantalum (Ta), etc.

As the insulating layer to be interposed between the source/drain electrodes and the diffusion preventive layer, there may be used polyimide materials such as polyamide resin, polyamide resin or the like, and inorganic materials such as silicon nitride, silicon oxide or the like.

It is noted that the conventional materials and methods for forming the gate electrode, gate insulating layer, and source/drain electrodes may be applied as they are.

What is claimed is:

1. In a thin-film transistor comprising an insulating substrate, a gate electrode formed on the substrate, a gate insulating layer covering the gate electrode, a first semiconductor layer formed on the gate insulating layer, and source and drain electrodes electrically connected to the first semiconductor layer, the improvement comprising:

a protective layer formed on the first semiconductor layer above the gate electrode;

an insulating layer interposed between the source and drain electrodes and the first semiconductor layer, said insulating layer having a portion which overlies said gate electrode and said protective layer, and said insulating layer being provided with a pair of openings through which the source and drain electrodes are electrically connected to the first semiconductor layer; and source and drain electrical connection members disposed between said insulating layer and the first semiconductor layer, for electrically connecting the source and drain electrodes to the first semiconductor layer;

wherein each said electrical connection member comprises a second semiconductor layer containing p-type or n-type impurity atoms and formed on the first semiconductor layer, and a diffusion preventive layer disposed between said second semiconductor layer and both said source and drain electrodes and said insulating layer for preventing metal constituting the source and drain electrodes from diffusing into said second semiconductor layer; said second semiconductor layer and said diffusion preventive layer partially overlap said protective layer; said insulating layer partially overlaps said second semiconductor layer and said diffusion preventive layer; and said source and drain electrodes overlie said insulating layer.

2. The thin-film transistor according to claim 1, wherein said protective layer is disposed between the first semiconductor layer and the portion of said insulating layer which overlies the gate electrode, for protecting the first semiconductor layer.

* * * * *